(12) United States Patent
Morino et al.

(10) Patent No.: US 10,852,790 B2
(45) Date of Patent: Dec. 1, 2020

(54) ELECTRONIC APPARATUS HAVING A SUCTION PORT

(71) Applicant: LENOVO (SINGAPORE) PTE. LTD., Singapore (SG)

(72) Inventors: Takayuki Morino, Kanagawa (JP); Masayuki Amano, Kanagawa (JP); Seita Horikoshi, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/561,229

(22) Filed: Sep. 5, 2019

(65) Prior Publication Data

US 2020/0081506 A1 Mar. 12, 2020

(30) Foreign Application Priority Data

Sep. 11, 2018 (JP) .................................. 2018-169971

(51) Int. Cl.
*G06F 1/16* (2006.01)
*G06F 1/20* (2006.01)
*H05K 7/20* (2006.01)

(52) U.S. Cl.
CPC ............ *G06F 1/203* (2013.01); *G06F 1/1616* (2013.01); *G06F 1/1647* (2013.01); *G06F 1/1681* (2013.01); *G06F 2200/201* (2013.01); *H05K 7/20172* (2013.01); *H05K 7/20336* (2013.01)

(58) Field of Classification Search
CPC .............................. G06F 1/1647; G06F 1/203

USPC ............. 361/679.04, 679.27, 679.46–679.49
See application file for complete search history.

(56) References Cited

U.S. PATENT DOCUMENTS

| 6,496,369 | B2 * | 12/2002 | Nakamura | G06F 1/1616 |
| | | | | 165/80.3 |
| 7,874,044 | B1 * | 1/2011 | Huang | G06F 1/1681 |
| | | | | 16/286 |
| 9,304,558 | B2 * | 4/2016 | Horii | G06F 1/1616 |
| 9,501,097 | B2 * | 11/2016 | Moser | G06F 1/1616 |
| 10,114,444 | B2 * | 10/2018 | MacDonald | G06F 1/1632 |
| 10,289,176 | B1 * | 5/2019 | Chen | G06F 1/203 |
| 10,520,990 | B2 * | 12/2019 | Chen | G06F 1/203 |
| 2012/0274565 | A1 * | 11/2012 | Moser | G06F 1/1616 |
| | | | | 345/168 |

(Continued)

FOREIGN PATENT DOCUMENTS

| JP | 09-138717 A | 5/1997 |
| JP | 2001242955 A | 9/2001 |
| JP | 2002271049 A | 9/2002 |

(Continued)

*Primary Examiner* — Anthony Q Edwards
(74) *Attorney, Agent, or Firm* — Antony P. Ng; Russell Ng PLLC

(57) ABSTRACT

An electronic apparatus having a suction port is disclosed. The electronic device includes a first main body, a second main body that has a main display and is coupled to the first main body to be rotationally movable around a first hinge, and a sub display that is installed on an upper surface of the first main body to be rotationally movable around a second hinge, and is configured to be opened relative to the first main body when the second main body is opened relative to the first main body. A suction port is formed in a part of the first main body that is covered with the sub display when the sub display is closed.

9 Claims, 3 Drawing Sheets

(56) References Cited

U.S. PATENT DOCUMENTS

2018/0188774 A1    7/2018   Ent et al.
2018/0210504 A1    7/2018   Moser

FOREIGN PATENT DOCUMENTS

| JP | 2004246847 A | 9/2004 |
| JP | 2004310238 A | 11/2004 |
| JP | 2006134329 A | 5/2006 |
| JP | 2018-049536 A | 3/2018 |
| JP | 2018049536 A | 3/2018 |

\* cited by examiner

ELECTRONIC APPARATUS HAVING A SUCTION PORT

PRIORITY CLAIM

The present application claims benefit of priority under 35 U.S.C. §§ 120, 365 to the previously filed Japanese Patent Application No. JP2018-169971 with a priority date of Sep. 11, 2018, which is incorporated by reference herein.

TECHNICAL FIELD

The present invention relates to electronic apparatuses in general, and in particular to an electronic apparatus having a suction port.

BACKGROUND

An electronic apparatus is typically equipped with processors such as central processing units (CPUs), graphics processing units (GPUs), etc. A fan adapted to cool these processors can be installed in a chassis of the electronic apparatus. Suction ports through which outside air is introduced into the chassis are formed in an upper surface and a lower surface of the chassis.

With the size reduction of electronic apparatuses, there are cases where it is impossible to sufficiently secure an opening area for suction ports. In addition, if the size of a suction port is made larger in order to increase a flow rate of air sent by a fan, the appearance of the entire electronic apparatus may be impaired.

Consequently, it would be desirable to provide an improved electronic apparatus that is able to sufficiently secure an opening area for a suction port.

SUMMARY

In accordance with an embodiment of the present disclosure, an electronic apparatus includes a first main body, a second main body that has a main display and is coupled to the first main body to be rotationally movable around a first hinge and a sub display which is installed on an upper surface of the first main body to be rotationally movable around a second hinge and is configured to be opened relative to the first main body when the second main body is opened relative to the first main body, in which a suction port is formed in a part of the first main body which is covered with the sub display when the sub display is closed.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
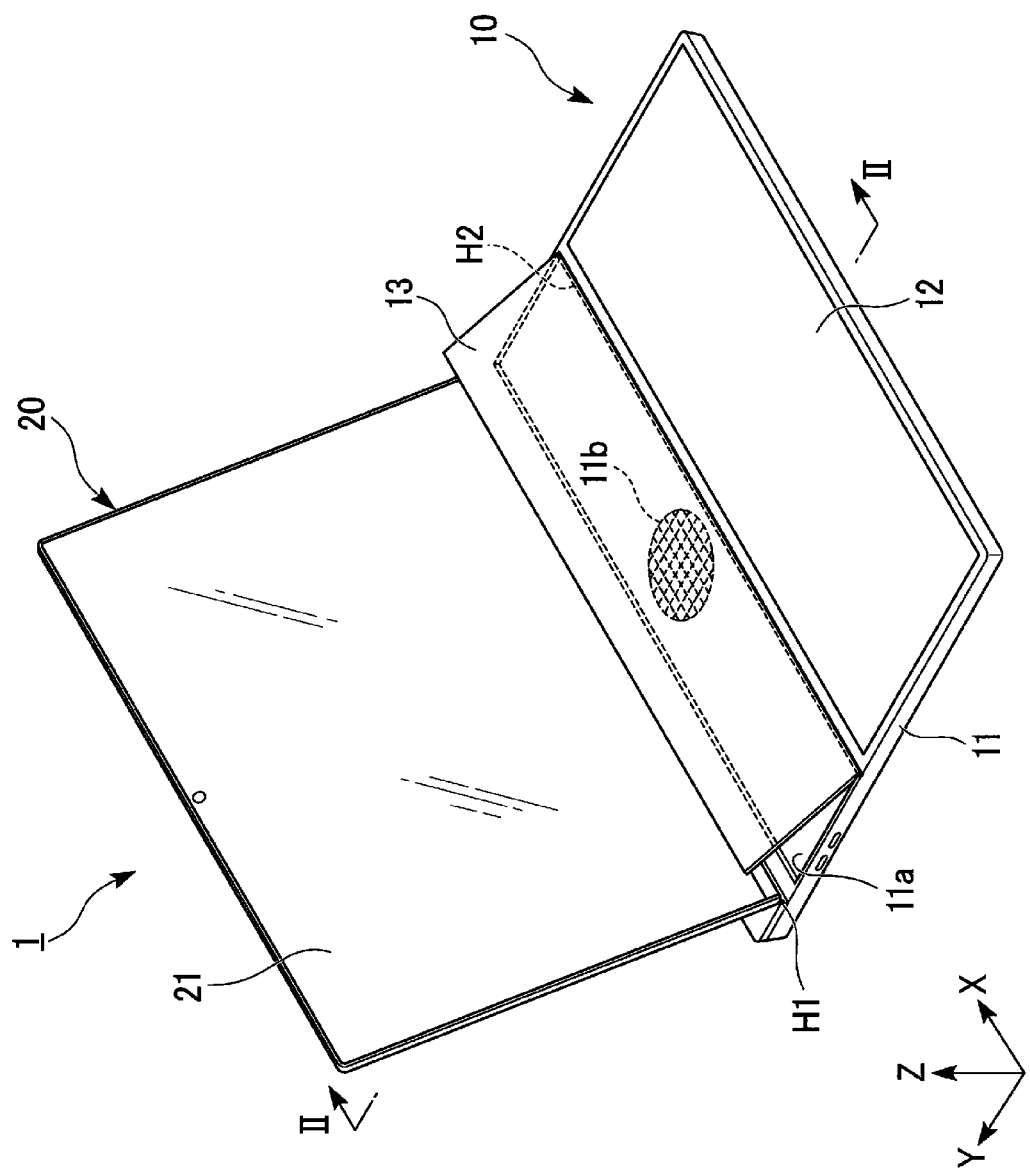
FIG. 1 is a perspective view illustrating one example of an electronic apparatus, according to one embodiment.

As illustrated in FIG. 1, an electronic apparatus 1 is a so-called clamshell-type (laptop) personal computer (PC) that has a first main body 10 and a second main body 20. The second main body 20 is coupled to the first main body 10 via a first hinge H1 to be rotationally movable. The first main body 10 and the second main body 20 are configured to be relatively movable around the first hinge H1 between a closed state and an opened state. The present embodiment may be applied also to electronic apparatuses other than laptop PCs.

I. Definition of Directions

In the present embodiment, a positional relation along respective configurations will be described by setting an XYZ orthogonal coordinate system. In the following, a direction which is along an X axis will be referred to as a right-left direction X, a direction which is along a Y axis will be referred to as a front-rear direction Y and a direction which is along a Z axis will be referred to as a top-bottom direction Z. In the top-bottom direction Z, the first main body 10 side will be referred to as "downward" and the second main body 20 side will be referred to as "upward." In the front-rear direction Y, the side which is closer to the first hinge H1 will be referred to as "rearward" and the side which is opposite thereto will be referred to as "forward."

II. Second Main Body

The second main body 20 has a main display 21. The main display 21 is installed on a surface of the second main body 20 which faces an upper surface of the first main body 10 (an upper surface of a chassis 11) in a state where the electronic apparatus 1 is closed. As the main display 21, a liquid crystal display, or an organic EL (electroluminescence) display may be used.

The second main body 20 is formed into a flat plate shape which extends in the right-left direction X and the front-rear direction Y in a state where the electronic apparatus 1 is closed. The second main body 20 is formed into a rectangular shape which is made longer in the right-left direction X than in the front-rear direction Y. The first hinge H1 which couples the first main body 10 and the second main body 20 together extends along the right-left direction X. When the electronic apparatus 1 shifts from the closed state to the opened state, the second main body 20 rotationally moves upward around the first hinge H1. An angle θ1 (see FIG. 2B) through which the second main body 20 is rotationally movable around the first hinge H1 relative to the first main body 10 is, for example, 90°≤θ1≤180°.

The first hinge H1 supports a lower end of the second main body 20 to be rotatable. When the second main body 20 is opened relative to the first body 10, the main display 21 is exposed forward and the upper surface of the first main body 10 (the upper surface of the chassis 11) is brought into an open state.

III. First Main Body

As illustrated in FIG. 1, the first main body 10 is formed into a flat plate shape which extends in the right-left direction X and the front-rear direction Y. The first main body 10 is formed into a rectangular shape which is made longer in the right-left direction X than in the front-rear direction Y. The first main body 10 includes the chassis 11, an input section 12 and a sub display 13. The input section 12 has a keyboard, a touch panel, a touch sensor and so forth.

The input section 12 and the sub display 13 are arranged on the upper surface of the chassis 11 in a state of being lined up in the front-rear direction Y. The sub display 13 is arranged on the first hinge H1 side (rearward) of the input section 12 in the front-rear direction Y. That is, the sub display 13 is located between the input section 12 and the first hinge H1 when seen from the top-bottom direction Z. When the second main body 20 is closed relative to the first main body 10, the sub display 13 faces the main display 21 on the second main body 20 in the top-bottom direction Z.

The chassis 11 is a casing which has an upper surface, a left surface, a right surface, a front surface, a back surface and a bottom surface. The chassis 11 is made of a resin and so forth.

Figure 3:
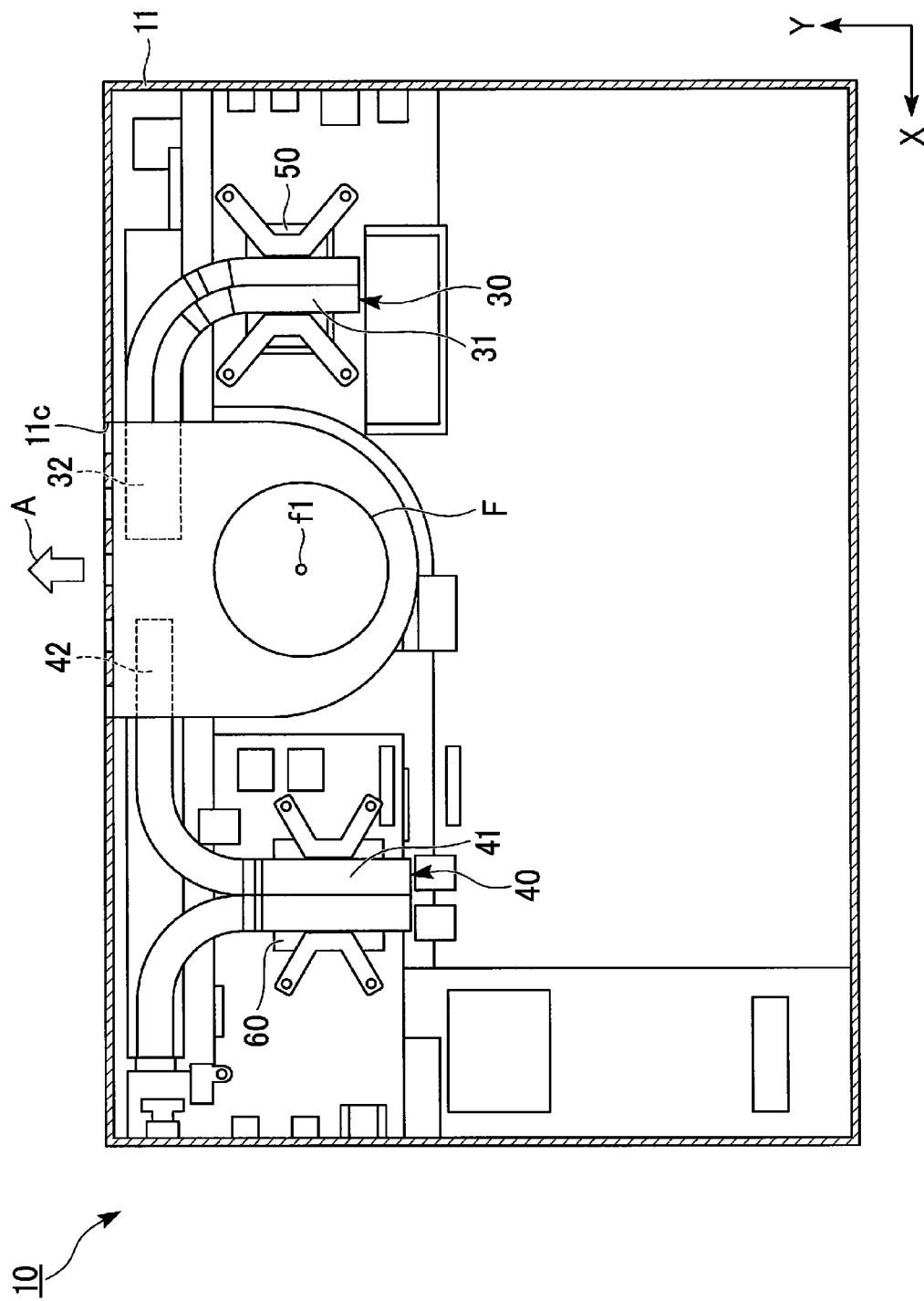
FIG. 3 is a diagram illustrating one example of a layout of respective components in a first main body when the electronic apparatus in FIG. 1 is seen from below.

As illustrated in FIG. 3, a central processing unit (CPU) 50, a graphics processing unit (GPU) 60, a fan F, a first heat pipe 30, a second heat pipe 40 are housed in the chassis 11. In the present specification, the CPU 50 and the GPU 60 will be generically called processors. The processors such as the CPU 50, the GPU 60 and so forth are heat generation sources which generate heat and there are many cases where it is necessary to cool the processors.

Each of the heat pipes 30 and 40 is a heat transfer member which has a pipe which is made of a metal, a working fluid which is sealed in the pipe and a wick. Copper, aluminum and so forth may be used as materials of the pipe. Water and so forth may be used as the working fluid. A porous material and so forth may be used as the wick. Pores which act to generate capillary force in the working fluid which is in a liquid phase are formed in the wick.

Longitudinal ends of the heat pipes 30 and 40 function as evaporation parts and condensation parts for the working fluid respectively. In the present embodiment, in the first heat pipe 30, an end which is close to or abuts on the CPU 50 which is the heat generation source is called an evaporation part 31 and an end which is opposite to the above-described end is called a condensation part 32. In addition, in the second heat pipe 40, an end which is close to or abuts on the GPU 60 which is the heat generation source is called an evaporation part 41 and an end which is opposite to the above-described end is called a condensation part 42.

The fan F is a centrifugal fan which rotates blades (not illustrated) around a rotary shaft f1 and thereby sends out air to the outside in a radius direction of the rotary shaft f1. The fan F makes an air flow generate in the chassis 11 and cools heating elements in the chassis 11 with the generated air flow. Incidentally, heat generation sources (a battery) other than the processors may be cooled with the air flow of the fan F.

Figure 2A:
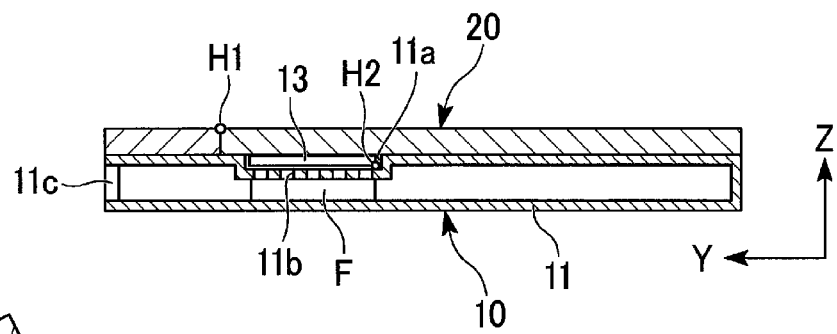
FIG. 2A is a diagram illustrating one example of a state where a second main body is closed.
Figure 2B:
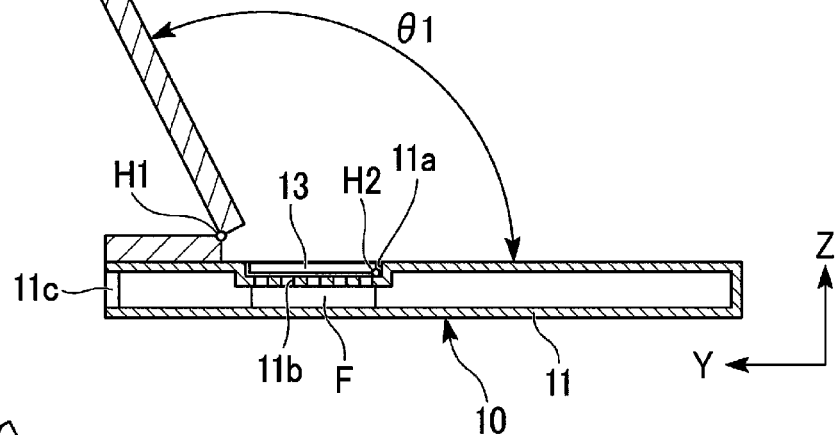
FIG. 2B is a diagram illustrating one example of a state where the second main body is opened.
Figure 2C:
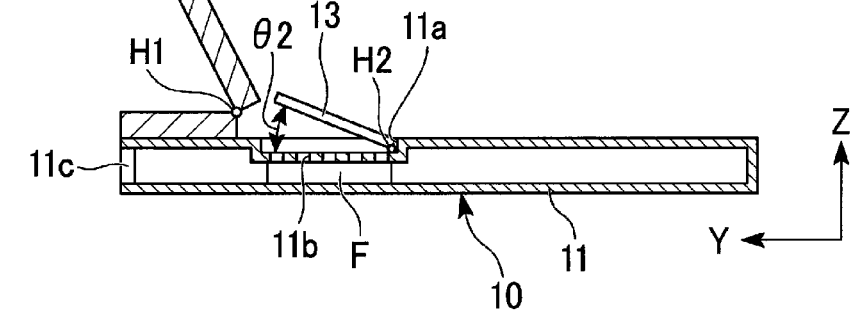
FIG. 2C is a diagram illustrating one example of a state where a sub display is opened.

As illustrated in FIGS. 2A, 2B and 2C, a housing section 11a, a suction port 11b and an exhaust port 11c are formed in the chassis 11. The housing section 11a is a recessed section which is dented downward from the upper surface of the chassis 11. The housing section 11a is formed into a rectangular shape which is made longer in the right-left direction X than in the front-rear direction Y when seen from the top-bottom direction Z (see FIG. 1). The housing section 11a is larger than the sub display 13 and is formed to make housing of the sub display 13 therein possible.

The suction port 11b is formed in order to introduce outside air into the chassis 11 when the fan F operates. The suction port 11b in the present embodiment is a plurality of through-holes which is formed in a bottom surface of the housing section 11a and pierces the chassis 11 in the top-bottom direction Z. The suction port 11b is covered with the sub display 13 from above in a state where the sub display 13 is housed in the housing section 11a. The suction port 11b is formed at a position where the suction port 11b overlaps the fan F and the sub display 13 when seen from the top-bottom direction Z. The suction port 11b is sandwiched between the sub display 13 and the fan F in the top-bottom direction Z. Although it is possible to appropriately change a concrete form of the suction port 11b, a plurality of almost quadrilateral through-holes may be arranged into a circular form conforming with the shape of the fan F, for example, as illustrated in FIG. 1.

Incidentally, an auxiliary suction port may be formed in another part of the chassis 11 as necessary. The exhaust port 11c is formed in order to discharge the air which is introduced into the chassis 11 through the suction port 11b by the fan F to the outside of the chassis 11. As illustrated in FIG. 2, the exhaust port 11c in the present embodiment is formed in the back surface (a surface which faces rearward) of the chassis 11. Describing in more detail, the exhaust port 11c pierces the back surface of the chassis 11 in the front-rear direction Y. In addition, as illustrated in FIG. 3, a set of the exhaust ports 11c is formed at intervals in the right-left direction X.

Incidentally, an auxiliary exhaust port may be formed in another part of the chassis 11 as necessary. The air that is introduced into the chassis 11 through the suction port 11b by the fan F is sent out to the outside in the radius direction of the rotary shaft f1. At least part of the air which is sent out by the fan F is discharged to the outside of the chassis 11 through the exhaust port 11c as indicated by an arrow A in FIG. 3. The condensation parts 32 and 42 of the heat pipes 30 and 40 are arranged between the fan F and the exhaust port 11c. For this reason, the condensation parts 32 and 42 are cooled with the air flow which is generated by the fan F. Incidentally, fins and so forth may be attached to the condensation parts 32 and 42 in order to efficiently perform heat exchange by the condensation parts 32 and 42.

The sub display 13 which is illustrated in FIG. 1 has an image display section which is composed of liquid crystals and so forth. The image display section is installed on the upper surface of the sub display 13. The liquid crystal display, the organic EL display and so forth may be used as the image display section. The sub display 13 is formed into a rectangular shape which is made longer in the right-left direction X than in the front-rear direction Y when seen from the top-bottom direction Z. The sub display 13 is housed in the housing section 11a in a state of being rotationally movable around the second hinge H2. The second hinge H2 is installed in the housing section 11a and extends along the right-left direction X.

The sub display 13 is configured to open relative to the first main body 10 when the second main body 20 is opened relative to the first main body 10. The sub display 13 may be also configured to rotationally move around the second hinge H2 manually. In this case, a torque hinge and so forth which are able to hold the sub display 13 at a predetermined angle may be preferably used as the second hinge H2. Alternatively, the sub display 13 may be brought into an upward biased state by using a biasing member such as a spring and so forth and in a case where the second main body 20 is closed, the second main body may 20 bring the sub display 13 into a pressed-down state. In this case, when the second main body 20 is opened, it becomes possible to automatically raise the sub display 13 in linkage with the second main body 20.

An angle θ2 (see FIG. 2C) through which the sub display 13 is rotationally movable around the second hinge H2 is set within a range of 2°≤θ2≤40°.

Although illustration is omitted, the sub display 13 is arranged at a position where the sub display 13 overlaps the CPU 50 and the GPU 60 when seen from the top-bottom direction Z. That is, the CPU 50 and the GPU 60 are arranged under the sub display 13.

Next, the operation of the electronic apparatus 1 which is configured in the above-mentioned way will be described. In the evaporation parts 31 and 41 which are illustrated in FIG. 3, the working fluid in the heat pipes 30 and 40 receives heat from the CPU 50 and the GPU 60 and evaporates. Since pressures are increased in the evaporation parts 31 and 41 due to evaporation of the working fluid, the vapor-phase working fluid moves toward the condensation parts 32 and 42 with the aid of the pressures. Heat is removed from the working fluid with an air flow which is generated by the fan F in the condensation parts 32 and 42. The air flow which removes heat from the working fluid is discharged to the outside of the chassis 11 through the exhaust port 11c.

The working fluid from which heat is removed in the condensation parts 32 and 42 is condensed into a liquid-phase state. The working fluid which is condensed into the liquid-phase state flows toward the evaporation parts 31 and 41 with the aid of capillary force passing through the pores which are formed in the wick. The liquid-phase working fluid which reaches the evaporation parts 31 and 41 receives heat again from the CPU 50 and the GPU 60 and evaporates. Then, the above-mentioned operations are repeated.

The heat pipes 30 and 40 are able to continuously transport heat from the evaporation parts 31 and 41 toward the condensation parts 32 and 42 respectively in this way. That is, it becomes possible to continuously cool the CPU 50 and the GPU 60.

Here, in order to increase cooling efficiencies of the CPU 50 and the GPU 60, it is effective to increase the flow rate of the air flow which is generated in the chassis 11 by the fan F. Thereby, it becomes possible to smoothly transfer the heat from the heat pipes 30 and 40 to air in the condensation parts 32 and 42 respectively.

On the other hand, in order to increase the flow rate of the air flow which is generated by the fan F, it is requested to increase an opening area of the suction port 11b. In the related art electronic apparatuses, there are many cases where the suction port(s) are/is formed in the side surface and/or the lower surface of the chassis. However, in recent years, downsizing of the electronic apparatus is promoted and therefore in a case where the suction port(s) are/is formed in the side surface and/or the lower surface of the chassis, there are cases where the opening area becomes insufficient. In addition, when the suction port which has a wide opening area is formed in a part around, for example, a keyboard and so forth on the upper surface of the chassis, there are cases where the appearance of the electronic apparatus is impaired.

Accordingly, in the present embodiment, the first main body 10 has the sub display 13 which is rotationally movable around the second hinge H2. Then, the suction port 11b is formed in a part which is covered with the sub display 13 when the sub display 13 is closed in the first main body 10 (the chassis 11). Owing to this configuration, when the sub display 13 rotationally moves upward around the second hinge H2, a space above the suction port 11b is made open thereby to shift to a state of making it possible to introduce the outside air into the chassis 11 through the suction port 11b. On the other hand, the sub display 13 functions as a blindfold and thereby it becomes difficult to visually confirm the suction port 11b from the user side. Accordingly, it becomes possible to secure the opening area of the suction port 11b while preferably keeping the appearance of the electronic apparatus 1.

In addition, the housing section 11a which is dented downward is formed in the upper surface of the chassis 11 and the sub display 13 is housed in the housing section 11a. Owing to this configuration, when the electronic apparatus 1 is distributed and is not used, the sub display 13 does not greatly protrude from the upper surface of the chassis 11 and therefore it becomes possible to reduce a top-bottom direction thickness of the electronic apparatus 1 which is in the closed state. Further, owing to formation of the suction port 11b in the bottom surface of the housing section 11a, it becomes more difficult to visually confirm the suction port 11b from the user side.

In addition, the sub display 13 and the suction port 11b are located on a part between the input section 12 and the first hinge H1 in the first main body 10 when seen from the top-bottom direction Z. It becomes more difficult to visually confirm the suction port 11b from the user side by forming the suction port 11b on the rear of the input section 12 when seen from the user side.

In addition, the CPU 50 and the GPU 60 which are the processors are arranged under the sub display 13. Thereby, the distance between each of the CPU 50 and the GPU 60 and the input section 12 is increased and thereby it becomes possible to have difficulty in transferring the heat that the CPU 50 and the GPU 60 generate to the input section 12.

In addition, the suction port 11b is located between the first hinge H1 and the second hinge H2 when seen from the top-bottom direction. Further, the angle ?2 through which the sub display 13 is rotationally movable around the second hinge H2 is set to 2°≤θ2≤40°. Thereby, when the sub display 13 is raised by rotationally moving the sub display 13 around the second hinge H2, the sub display 13 comes to locate between the user and the suction port 11b more surely. Accordingly, it becomes more difficult to visually confirm the suction port 11b from the user side and it becomes also difficult to transmit operating noises of the fan F to the user. That is, the sub display 13 functions as a blindfold board and a sound insulating board, the appearance of the electronic apparatus 1 becomes preferable and it becomes also possible to improve quietness.

Incidentally, since a sufficient air channel is secured between the suction port 11b and the sub display 13 by setting the angle θ2 to 2° or more, it becomes possible to effectively introduce air into the chassis 11.

Incidentally, the technical range of the present invention is not limited to the aforementioned embodiment and it is possible to add various alterations and modifications within a range not deviating from the gist of the present invention.

In addition, it is appropriately possible to replace a constitutional element in the above-described embodiment with a well-known constitutional element and the above-described embodiment and altered and/or modified examples may be appropriately combined with each other/one another.

As has been described, the present invention provides an improved electronic apparatus that is able to sufficiently secure an opening area of a suction port.

While the invention has been particularly shown and described with reference to a preferred embodiment, it will be understood by those skilled in the art that various changes in form and detail may be made therein without departing from the spirit and scope of the invention.

What is claimed is:

1. An electronic apparatus comprising:
   a first main body;
   a second main body having a main display, coupled to said first main body to be rotationally movable around a first hinge;
   a sub display installed on an upper surface of said first main body to be rotationally movable around a second hinge, and is allowed to be opened relative to said first main body when said second main body is opened relative to said first main body;
   a suction port formed in a part of said first main body that is covered by said sub display when said sub display is in a closed position, wherein said suction port is located between said first hinge and said second hinge when viewed from a top-bottom direction; and
   a fan located underneath said suction port.

2. The electronic apparatus of claim 1, wherein said first main body includes a housing section located on said upper surface of said first main body.

3. The electronic apparatus of claim 2, wherein said sub display is housed in said housing section when said sub display is in said closed position.

4. The electronic apparatus of claim 2, wherein said suction port is located on a surface of said housing section.

5. The electronic apparatus of claim 1, wherein said first main body includes a keyboard.

6. The electronic apparatus of claim 5, wherein said sub display is located between said keyboard and said first hinge when seen from a top-bottom direction.

7. The electronic apparatus of claim 1, wherein a processor is installed within said first main body.

8. The electronic apparatus of claim 1, wherein when an angle $\theta 2$ through which said sub display is rotationally movable around said second hinge is $2°\leq \theta 2 \leq 40°$.

9. The electronic apparatus of claim 1, wherein said first main body further includes an exhaust port for discharging air introduced into said first main body through said suction port by said fan to the outside of said first main body.

* * * * *